United States Patent
Tokusho et al.

(10) Patent No.: US 11,004,715 B2
(45) Date of Patent: May 11, 2021

(54) SUBSTRATE SUPPORTING DEVICE

(71) Applicant: NGK SPARK PLUG CO., LTD., Aichi (JP)

(72) Inventors: Noriaki Tokusho, Tsuruoka (JP); Shunichi Sasaki, Tomiya (JP); Tomohiro Ishino, Tomiya (JP); Hisanori Aoyama, Tomiya (JP); Makoto Hino, Sendai (JP); Kenichi Fukazawa, Sendai (JP); Atsushi Tsuchida, Izumi-ku (JP); Toshiya Umeki, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 591 days.

(21) Appl. No.: 15/742,346

(22) PCT Filed: Feb. 6, 2017

(86) PCT No.: PCT/JP2017/004138
§ 371 (c)(1),
(2) Date: Jan. 5, 2018

(87) PCT Pub. No.: WO2017/154435
PCT Pub. Date: Sep. 14, 2017

(65) Prior Publication Data
US 2018/0204754 A1    Jul. 19, 2018

(30) Foreign Application Priority Data

Mar. 7, 2016 (JP) .............................. JP2016-043633

(51) Int. Cl.
*H01L 21/683* (2006.01)
*H01L 21/02* (2006.01)
(Continued)

(52) U.S. Cl.
CPC ...... *H01L 21/683* (2013.01); *H01L 21/02107* (2013.01); *H01L 21/67098* (2013.01);
(Continued)

(58) Field of Classification Search
CPC ............. H01L 21/683; H01L 21/02107; H01L 21/67098; H01L 21/67103;
(Continued)

(56) References Cited

U.S. PATENT DOCUMENTS 9,725,806 B2 * 8/2017 Lin .................... H01L 21/67103
10,249,526 B2 * 4/2019 Parkhe .............. H01L 21/67109
(Continued)

FOREIGN PATENT DOCUMENTS

| JP | 11-68420 A | 3/1999 |
| JP | 2007-258115 A | 10/2007 |

(Continued)

OTHER PUBLICATIONS

Korean Intellectual Property Office, Office Action (Notification of Reason for Refusal) issued in corresponding Application No. 10-2017-7036381 dated Apr. 29, 2019.
(Continued)

*Primary Examiner* — Paul R Durand
*Assistant Examiner* — Andrew P Bainbridge
(74) *Attorney, Agent, or Firm* — Stites & Harbison, PLLC; Jeffrey A. Haeberlin; Gary N. Stewart

(57) ABSTRACT

A substrate supporting device having a feeder structure that enables a large number of electrodes to be successfully supplied with power. A ceramic heater 100 includes a base 10 having an upper surface as a support surface on which a substrate is supported, electrodes 20 embedded in the base 10, a base-supporting member 30 that is mounted on a lower surface of the base 10 and that is formed of a heat insulating material, and feeder rods 40 that extend through respective
(Continued)

through-holes 35 formed in a circumferential wall 34 of the base-supporting member 30 and extending in the vertical direction and that are electrically connected to the electrodes 20.

2 Claims, 3 Drawing Sheets

(51) Int. Cl.
    *H05B 3/20*     (2006.01)
    *H01L 21/67*     (2006.01)
    *H05B 3/03*     (2006.01)
    *H01L 21/687*     (2006.01)
    *H05B 3/28*     (2006.01)
    *H05B 3/12*     (2006.01)

(52) U.S. Cl.
    CPC .. *H01L 21/67103* (2013.01); *H01L 21/68792* (2013.01); *H05B 3/03* (2013.01); *H05B 3/12* (2013.01); *H05B 3/20* (2013.01); *H05B 3/283* (2013.01); *H05B 2203/016* (2013.01)

(58) Field of Classification Search
    CPC ....... H01L 21/68792; H05B 3/03; H05B 3/12; H05B 3/20; H05B 3/283; H05B 2203/016
    USPC ......... 219/541, 390, 411; 118/715, 724, 728
    See application file for complete search history.

(56) References Cited

U.S. PATENT DOCUMENTS

| | | | |
|---|---|---|---|
| 10,557,190 B2* | 2/2020 | Taga | ............................ C23C 4/08 |
| 2003/0136520 A1* | 7/2003 | Yudovsky | ............ C23C 16/4586 |
| | | | 156/345.51 |
| 2007/0221648 A1 | 9/2007 | Unno et al. | |
| 2009/0031955 A1* | 2/2009 | Lu | ........................ C23C 16/4584 |
| | | | 118/728 |
| 2016/0293460 A1* | 10/2016 | Ohashi | .............. H01L 29/66795 |
| 2018/0076067 A1* | 3/2018 | Kitabayashi | ...... H01L 21/68785 |
| 2018/0174878 A1* | 6/2018 | Kimura | ............. H01L 21/67103 |
| 2019/0131167 A1* | 5/2019 | Rice | .................. H01L 21/68764 |

FOREIGN PATENT DOCUMENTS

| | | |
|---|---|---|
| JP | 2010065303 A | 3/2010 |
| JP | 2011-49428 A | 3/2011 |
| JP | 2011-165891 A | 8/2011 |
| JP | 2015-220368 A | 12/2015 |

OTHER PUBLICATIONS

Japan Patent Office, International Search Report (ISR) in International Stage of the instant application, dated Apr. 25, 2017.

* cited by examiner

SUBSTRATE SUPPORTING DEVICE

TECHNICAL FIELD

The present invention relates to a substrate supporting device that supports a substrate such as a semiconductor wafer.

BACKGROUND ART

In a semiconductor-manufacturing apparatus, a substrate supporting device such as a ceramic heater that supports and heats a semiconductor wafer on a ceramic base is used in various processes.

As semiconductor layout has finer patterns, temperature in a process needs to be strictly managed, and a multi-zone heater that includes divided electrodes embedded in the ceramic base and that controls independently an electric current flowing through the electrodes is commonly used. In recent years, there are an eight-zone heater including eight divided electrodes and a ten-zone heater including ten divided electrodes.

Such a ceramic heater needs a pair of feeder rods for each electrode. As described in, for example, PTL 1, the feeder rods are connected to respective terminals (connection members) that are connected and secured to the electrode, and the feeder rods extend through the inside of a hollow shaft secured to the lower surface of the ceramic base.

CITATION LIST

Patent Literature

PTL 1: Japanese Unexamined Patent Application Publication No. 2011-49428

SUMMARY OF INVENTION

Technical Problem

However, the multi-zone heater, such as the eight-zone heater or the ten-zone heater, includes a large number of feeder rods, and it is difficult for the feeder rods to be disposed in the shaft without contact with each other.

The present invention has been accomplished in view of such circumstances, and it is an object of the present invention to provide a substrate supporting device having a feeder structure that enables a large number of the electrodes to be successfully supplied with power.

Solution to Problem

A first substrate supporting device according to the present invention includes a base having an upper surface as a support surface on which a substrate is supported, an electrode embedded in the base, a base-supporting member that is mounted on a lower surface of the base and that is formed of a heat insulating material, and feeder rods or feeder wires that extend through respective through-holes formed in a circumferential wall of the base-supporting member and extending in a vertical direction and that are electrically connected to the electrode.

In the first substrate supporting device according to the present invention, since the feeder rods or the feeder wires extend through the respective through-holes, which are formed in the circumferential wall of the base-supporting member formed of the heat insulating material and which extend in the vertical direction, there is no risk that the feeder rods or the feeder wires electrically come into contact with each other. Accordingly, even when there are a number of electrodes, the electrodes can be successfully supplied with power via the feeder rods or the feeder wires.

The first substrate supporting device according to the present invention preferably includes a lid member that is mounted on a lower surface of the base-supporting member and that has a through-hole extending in the vertical direction through which the feeder rods or the feeder wires extend. Spaces between the feeder rods or the feeder wires and the through-hole of the lid member and a space between the base-supporting member and the lid member are preferably sealed.

In this case, since the spaces between the feeder rods or the feeder wires and the through-hole of the lid member and the space between the base-supporting member and the lid member are sealed, a hollow portion of the base-supporting member and the through-hole can be isolated from the outside. This facilitates manufacture of the base and the base-supporting member because the base and the base-supporting member are not joined to each other.

A second substrate supporting device according to the present invention includes a base having an upper surface as a support surface on which a substrate is supported, an electrode embedded in the base, a hollow base-supporting member that is mounted on a lower surface of the base and that is formed of a heat insulating material, a conductive film that is formed on an inner circumferential wall surface of the base-supporting member and extends in the vertical direction, or two or more conductive films that are formed on the inner circumferential wall surface of the base-supporting member and extend in the vertical direction and that are electrically independent of each other, and a connection member that electrically connects the electrode and the conductive film or the two or more conductive films to each other.

In the second substrate supporting device according to the present invention, since the conductive film or the two or more conductive films electrically independent of each other formed at a predetermined position on the inner circumferential wall surface of the base-supporting member formed of the heat insulating material to extend in the vertical direction are electrically connected to the electrode with the connection member interposed therebetween, there is no risk that the conductive films are short-circuited. Accordingly, even when there are a large number of electrodes, the electrodes can be successfully supplied with power via the conductive films.

A third substrate supporting device according to the present invention includes a base having an upper surface as a support surface on which a substrate is supported, an electrode embedded in the base, a hollow base-supporting member that is mounted on a lower surface of the base, an insertion member that is inserted in a hollow of the base-supporting member and that is formed of a heat insulating material, a conductive film that is formed on an outer circumferential wall surface of the insertion member and extends in the vertical direction, or two or more conductive films that are formed on the outer circumferential wall surface of the insertion member and extend in the vertical direction and that are electrically independent of each other, and a connection member that electrically connects the electrode and the conductive film or the two or more conductive films to each other.

In the third substrate supporting device according to the present invention, since the conductive film or the two or more conductive films electrically independent of each other formed at a predetermined position on the outer circumferential wall surface of the insertion member formed of the heat insulating material to extend in the vertical direction are electrically connected to the electrode with the connection member interposed therebetween, there is no risk that the conductive films are short-circuited. Accordingly, even when there are a large number of electrodes, the electrodes can be successfully supplied with power via the conductive films.

A fourth substrate supporting device according to the present invention includes a base having an upper surface as a support surface on which a substrate is supported, an electrode embedded in the base, a hollow base-supporting member that is mounted on a lower surface of the base, and a feeder wire having flexibility that extends through a hollow of the base-supporting member and that is electrically connected to the electrode.

In the fourth substrate supporting device according to the present invention, the feeder wire extends through the inside of a shaft unlike the case where the feeder rod extends through the inside of the shaft as described in the above PTL 1. In addition, since the flexible feeder wire is thinner than the feeder rod, the risk that the feeder wire comes into contact with other wires is reduced.

Accordingly, even when there are a large number of electrodes, the electrodes can be successfully supplied with power via feeder wires.

The fourth substrate supporting device according to the present invention preferably includes two or more connection members formed of a conductive material and a holding member that is formed of an insulating material and holds the two or more connection members, in which two or more electrodes, each of which is the electrode embedded in the base, and two or more feeder wires, each of which is the feeder wire having flexibility, are provided and each of the two or more feeder wires is connected to a corresponding one of the two or more connection members.

In this case, the holding member makes connection easier than the connection in the case where the feeder wires are electrically connected to the respective electrodes.

DESCRIPTION OF EMBODIMENTS

First Embodiment

Figure 1:
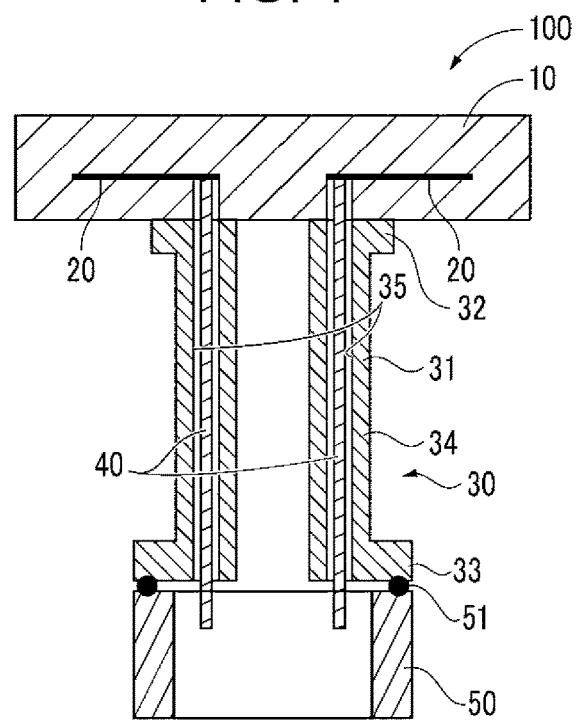
FIG. 1 is a schematic sectional view of a ceramic heater according to a first embodiment of the present invention.

A ceramic heater 100, which is a substrate supporting device according to a first embodiment of the present invention, will be described with reference to FIG. 1.

The ceramic heater 100 includes a base 10, electrodes 20, a base-supporting member (shaft) 30, and feeder rods 40.

According to the present embodiment, the electrodes 20 of the ceramic heater 100 function as resistive heating elements (heaters), and a substrate such as a semiconductor wafer that is supported on a support surface, which is the upper surface of the base 10, is heated by heat generated by a voltage being applied from the feeder rods 40 to the resistive heating elements.

However, a substrate supporting device according to the present invention may be an electrostatic chuck that sucks the substrate on the surface of the base 10 by using the Coulomb force produced by a voltage being applied from the feeder rods 40 to the electrodes 20.

A substrate supporting device according to the present invention may also be an electrostatic chuck having a heating function in which the electrode 20 near the surface functions as an electrostatic chuck electrode and the electrode 20 away from the surface functions as a resistive heating element.

A protective layer, for example, may be formed on the surface of the base 10. The base 10 may have a cooling structure in the inside thereof.

The base 10 is formed of a sintered ceramic body of, for example, alumina ($Al_2O_3$), aluminum nitride (AlN), or yttria ($Y_2O_3$). However, the base 10 may be formed of any material used as the material of the base of a ceramic heater or an electrostatic chuck.

For example, the base 10 is formed of sintered ceramic bodies each formed such that a molded body is molded from mixed material powder of high purity (for example, equal to or more than 99.9% pure) aluminum nitride powder in which, if necessary, a proper amount of sintering additive such as yttrium oxide powder is added, and the molded body is sintered by hot press.

The electrodes 20 are interposed between the sintered ceramic bodies, and these are hot-pressed. Consequently, the electrodes 20, which are each formed of mesh metal or metallic foil, are embedded in the base 10. However, the embedding method is not limited thereto. For example, metal powder that is the material of the electrodes 20 may be held between the above mixed materials and the whole may be hot-pressed. Alternatively, a recessed portion may be formed on the interface between the sintered ceramic bodies to embed the electrodes 20 therein, and subsequently, the sintered ceramic bodies may be joined to each other with a joining material.

The electrodes 20 are each formed of metal such as tungsten, molybdenum, alloy thereof, platinum, or titanium, and is in the form of, for example, a thin plate, a thin film, a mesh, or a line.

The base-supporting member 30 is formed of a material having heat insulating properties such as a sintered ceramic body of, for example, alumina ($Al_2O_3$), aluminum nitride (AlN), or yttria ($Y_2O_3$) and has a substantially cylindrical shape having a hollow as a whole. The base-supporting member 30, however, may not have a hollow portion.

According to the present embodiment, two or more electrodes 20 are provided which are electrically independent of each other. A voltage applied to each electrode 20 can be independently controlled. The ceramic heater 100 is a multi-zone heater. In order to independently control the voltage applied to each electrode 20, it is necessary to provide a pair of feeder structures for the electrode 20. Accordingly, the multi-zone heater needs twice as many feeder rods 40 as the electrodes 20 that are electrically independent of each other. The electrodes 20 may be embedded at different heights in the base 10.

The base-supporting member 30 is mounted on the lower surface of the base 10. The base-supporting member 30 includes, at the upper end, an enlarged-diameter portion 32 having a diameter larger than that of an intermediate portion 31. The upper surface of the enlarged-diameter portion 32 and the lower surface of the base 10 are joined to each other such that the contact surfaces are on the interface. The surfaces may be joined by being secured to each other by using a ceramic joining material or a brazing material, or by being fastened to each other by using a bolt and a nut.

The base-supporting member 30 includes, at the end portion on the side (lower side) opposite the interface, an enlarged-diameter portion 33 having a diameter larger than that of the intermediate portion 31. The base-supporting member 30 is secured to a lid member 50 with an O-ring 51 interposed therebetween. The base-supporting member 30 may be secured, for example, by being fastened by using a bolt and a nut. This enables a vacuum atmosphere outside the base-supporting member 30 to be successfully maintained.

In a circumferential wall 34 of the base-supporting member 30, as many through-holes 35 extending in an axial direction (vertical direction in FIG. 1) as the feeder rods 40 are formed to be separated from each other.

The feeder rods 40 are each formed of metal having high heat resistance, high acid resistance, and high conductivity, such as titanium (Ti) or nickel (Ni) and are in the form of a cylindrical rod according to the present embodiment. The feeder rods 40 are electrically connected to a power source, not illustrated, on the lower end side.

The feeder rods 40 are secured by, for example, brazing with end surfaces thereof being in contact with the back surfaces of the electrodes 20 and are electrically connected to the electrodes 20. The electrical connection between the electrodes 20 and the feeder rods 40 is not limited thereto as long as the structure is a connection structure used in a known ceramic heater. For example, terminals may be secured to the back surfaces of the electrodes 20, and ends of the feeder rods 40 may be detachably secured to the terminals.

The feeder rods 40 extend through the respective through-holes 35 formed in the circumferential wall 34 of the base-supporting member 30. Accordingly, there is no risk that the feeder rods 40 electrically come into contact with each other. Therefore, even when there are a large number of electrodes 20 and corresponding feeder rods 40, the electrodes 20 can be successfully supplied with power via the feeder rods 40.

(Modification to First Embodiment)

Figure 2:
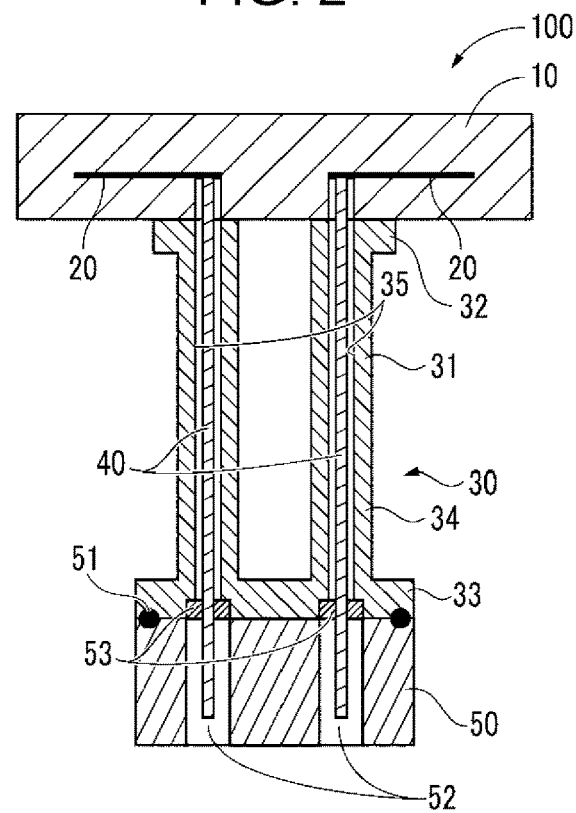
FIG. 2 is a schematic sectional view of a ceramic heater according to a modification to the first embodiment of the present invention.

As illustrated in FIG. 2, in the ceramic heater 100, the lid member 50 may have through-holes 52 extending in the vertical direction, through which the corresponding feeder rods 40 extend, and spaces between the through-holes 52 and the feeder rods 40 may be sealed by using sealing members 53 such as sealant, and the enlarged-diameter portion 33 and the lid member 50 may be secured to each other with the O-ring 51 interposed therebetween.

This facilitates manufacture of the base 10 and the base-supporting member 30 because the base 10 and the base-supporting member 30 are not joined to each other and enables the vacuum atmosphere outside the base-supporting member 30 to be successfully maintained.

In the ceramic heater 100, flexible feeder wires may be used instead of the feeder rods 40, although this is not illustrated.

Second Embodiment

Figure 3:
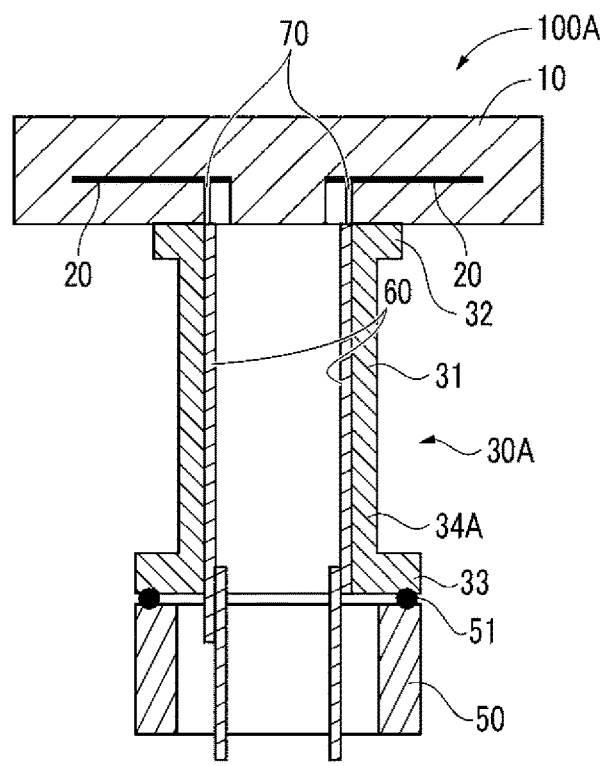
FIG. 3 is a schematic sectional view of a ceramic heater according to a second embodiment of the present invention.

A ceramic heater 100A, which is a substrate supporting device according to a second embodiment of the present invention, will be described with reference to FIG. 3. The ceramic heater 100A is similar to the above ceramic heater 100, and only differences will be described.

The ceramic heater 100A includes the base 10, the electrodes 20, a base-supporting member (shaft) 30A, conductive films 60, and connection members 70. The base-supporting member 30A differs from the base-supporting member 30, and a circumferential wall 34A of the base-supporting member 30A does not have the through-holes 35.

Twice as many conductive films 60 as the electrodes 20 that are electrically independent of each other are formed on the inner circumferential wall surface of the base-supporting member 30A and extend in the vertical direction to be electrically independent of each other. The conductive films 60 may be each formed of a conductive material such as titanium (Ti) or nickel (Ni) by a plating method, a thermal spraying method, or another method. It is preferable that, although this is not illustrated, the entire inner circumferential wall surface of the base-supporting member 30A, on which the conductive films 60 are formed, be covered by an insulating material such as alumina ($Al_2O_3$) or quartz ($SiO_2$) by application or thermal spraying to protect the conductive films 60 and to ensure the electrical independence.

The connection members 70 electrically connect the electrodes 20 and the conductive films 60 to each other. The connection members 70 are each formed of, for example, a conductive wire and may be secured to the electrodes 20 and the conductive films 60 by, for example, brazing.

In the ceramic heater 100A, the conductive films 60 are electrically connected to the respective electrodes 20 with the connection members 70 interposed therebetween. However, the conductive films 60 are formed at predetermined positions on the inner circumferential wall surface of the base-supporting member 30 formed of an insulating material, and accordingly, there is no risk that the adjoining electrodes come into contact with each other and short-circuited. Accordingly, even when there are a large number of electrodes 20, the respective electrodes 20 can be successfully supplied with power via the conductive films 60.

Third Embodiment

Figure 4:
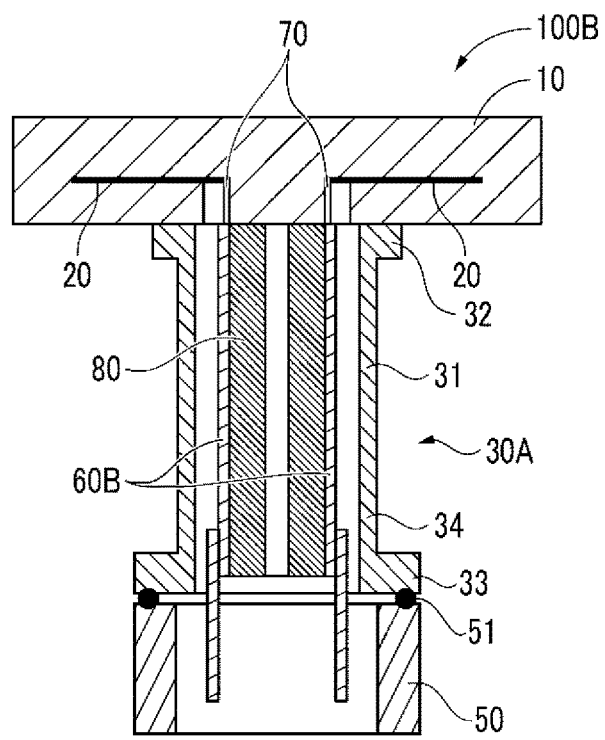
FIG. 4 is a schematic sectional view of a ceramic heater according to a third embodiment of the present invention.

A ceramic heater 100B, which is a substrate supporting device according to a third embodiment of the present invention, will be described with reference to FIG. 4. The ceramic heater 100B is similar to the above ceramic heaters 100 and 100A, and only differences will be described.

The ceramic heater 100B includes the base 10, the electrodes 20, the base-supporting member (shaft) 30A, conductive films 60B, and an insertion member 80.

The insertion member 80 is formed of the same heat insulating material as the base-supporting member 30A or a heat insulating material similar to the base-supporting member—30A, is substantially cylindrical, and is secured to the lower surface of the base 10 by, for example, brazing in a state where the insertion member is inserted in the hollow of the base-supporting member—30A.

Twice as many conductive films 60B as the electrodes 20 that are electrically independent of each other are formed on the outer circumferential wall surface of the insertion member 80 and extend in the vertical direction to be electrically independent of each other. The conductive films 60B may be formed in the same manner as in the case of the conductive films 60. It is preferable that, although this is not illustrated, the entire outer circumferential wall surface of the insertion member 80, on which the conductive films 60B are formed, be covered by an insulating material to protect the conductive films 60B and to ensure the electrical independence.

In the ceramic heater 100B, the conductive films 60B are electrically connected to the respective electrodes 20 with the connection members 70 interposed therebetween. The conductive films 60B are formed at predetermined positions on the outer circumferential wall surface of the insertion member 80 formed of an insulating material, and accordingly, there is no risk that the adjoining electrodes come into contact with each other and short-circuited. Accordingly, even when there are a large number of electrodes 20, the electrodes 20 can be successfully supplied with power via the conductive films 60B.

The conductive films 60B are formed on the outer circumferential wall surface of the insertion member 80 more easily than the case where the conductive films 60 are formed on the inner circumferential wall surface of the base-supporting member 30A.

Fourth Embodiment

Figure 5:
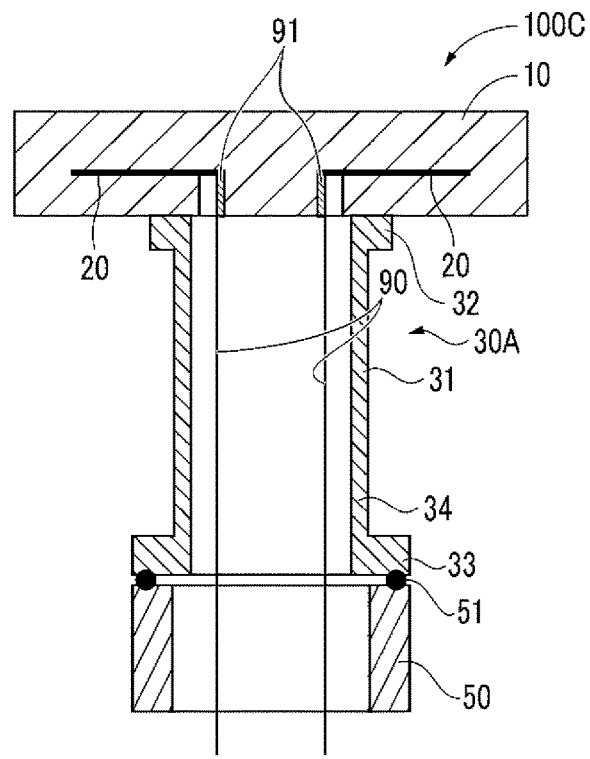
FIG. 5 is a schematic sectional view of a ceramic heater according to the fourth embodiment of the present invention.

A ceramic heater 100C, which is a substrate supporting device according to a fourth embodiment of the present invention, will be described with reference to FIG. 5. The ceramic heater 100C is similar to the above ceramic heater 100, and only differences will be described.

The ceramic heater 100C includes the base 10, the electrodes 20, the base-supporting member 30A, and feeder wires 90.

The feeder wires 90 differ from the feeder rods 40, which are thick and hence are not flexible, and are thin and flexible. The diameter of the feeder wires 90 is, for example, no less than 0.5 mm and no more than 2.0 mm.

There are twice as many feeder wires 90 as the electrodes 20 that are electrically independent of each other, and the feeder wires are electrically independent of each other and extend through the hollow of the base-supporting member 30A. In the case of a multi-zone heater having a large number of zones, the amount of power supplied to each electrode 20 decreases, and the feeder wires 90 can be used instead of the feeder rods 40. The feeder wire 90 may replace the feeder rod 40 electrically connected to the electrode 20 in a specific zone alone.

An end portion of each feeder wire 90 is electrically connected to a corresponding one of the electrodes 20. According to the present embodiment, the end portions are secured by, for example, brazing to respective terminals 91 secured to the back surfaces of the electrodes 20 by, for example, brazing. The electrical connection structure between the end portions of the feeder wires 90 and the electrodes 20 is not limited thereto.

In the ceramic heater 100C, the feeder wires 90 extend through the inside of the base-supporting member 30A unlike the case where the feeder rods extend through the inside of a substrate-supporting member as described in the above PTL 1. In addition, since the feeder wires 90 are thinner than the feeder rods, the risk that the feeder wires come into contact with each other is reduced. Accordingly, even when there are a large number of electrodes 20, the electrodes 20 can be successfully supplied with power via the feeder wires 90.

(Modification to Fourth Embodiment)

Figure 6:
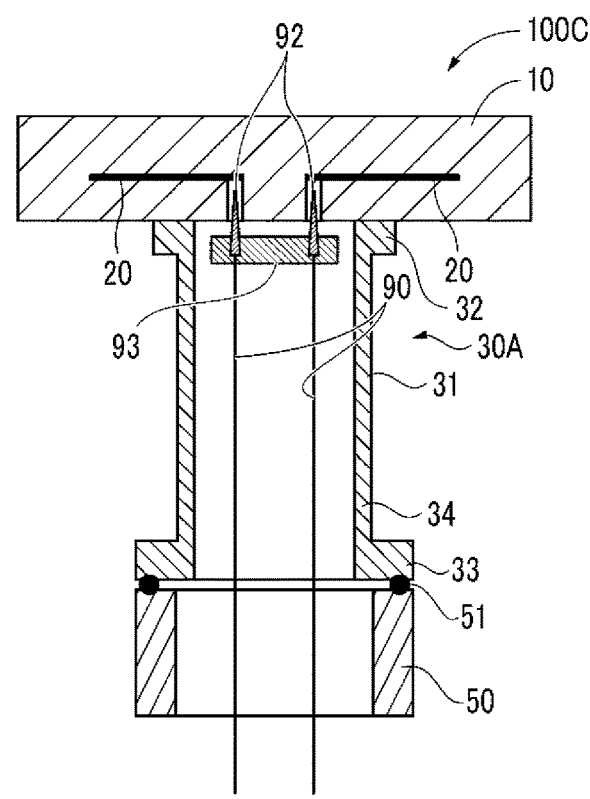
FIG. 6 is a schematic sectional view of a ceramic heater according to a modification to the fourth embodiment of the present invention.

As illustrated in FIG. 6, the ceramic heater 100C may include connection members 92 connected to the respective feeder wires 90, and a holding member 93 that holds the connection members 92.

The connection members 92 are each formed of, for example, metal such as titanium (Ti) or nickel (Ni). An end of each connection member 92 is in contact with the back surface of a corresponding one of the electrodes 20, and a rear end portion thereof is secured to an end portion of a corresponding one of the feeder wires 90 by, for example, brazing.

The holding member 93 is formed of, for example, a ceramic insulating material such as alumina ($Al_2O_3$) or quartz ($SiO_2$) and can hold the connection members 92. The connection members 92 may be firmly secured to the holding member 93 or may be detachably secured thereto.

The holding member 93 makes the connection easier than the connection in the case where the feeder wires 90 are electrically connected to the respective electrodes. For example, the connection members 92 and the electrodes 20 may come into contact with each other with a single action in which the holding member 93 is pressed toward the electrodes 20 so that this state is maintained.

REFERENCE SIGNS LIST

10 . . . base, 20 . . . electrode, 30, 30A . . . base-supporting member, 31 . . . intermediate portion, 32, 33 . . . enlarged-diameter portion, 34, 34A . . . circumferential wall, 35 through-hole, 40 . . . feeder rod, 50 . . . lid member, 51 . . . O-ring, 52 . . . through-hole, 60, 60B . . . conductive film, 70 connection member, 80 . . . insertion member, 90 . . . feeder wire, 91 . . . terminal, 92 . . . connection member, 93 . . . holding member, 100, 100A, 100B, 100C . . . ceramic heater (substrate supporting device).

The invention claimed is:

1. A substrate supporting device comprising:
   a base having an upper surface as a support surface for supporting a substrate;
   an electrode embedded in the base;
   a cylindrical base-supporting member having a hollow portion, the base-supporting member being mounted on a lower surface of the base and formed of a heat insulating material; and
   feeder rods or feeder wires that extend through respective through-holes formed in a circumferential wall of the base-supporting member and extending in a vertical direction and that are electrically connected to the electrode;
   wherein a diameter of the hollow portion is larger than a diameter of the respective through-holes.

2. The substrate supporting device according to claim 1, further comprising:
   a lid member that is mounted on a lower surface of the base-supporting member and that has a through-hole extending in the vertical direction through which the feeder rods or the feeder wires extend,
   wherein spaces between the feeder rods or the feeder wires and the through-hole of the lid member and a space between the base-supporting member and the lid member are sealed.

* * * * *